United States Patent
Kostelnik et al.

(10) Patent No.: US 11,942,326 B2
(45) Date of Patent: Mar. 26, 2024

(54) PROCESS OF FORMING AN ELECTRONIC DEVICE INCLUDING A DOPED GATE ELECTRODE

(71) Applicant: Semiconductor Components Industries, LLC, Phoenix, AZ (US)

(72) Inventors: Petr Kostelnik, Frenstat Pod Radhostem (CZ); Tomas Novak, Zubri (CZ); Peter Coppens, Kanegem (BE); Peter Moens, Erwetegem (BE); Abhishek Banerjee, Kruibeke (BE)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 181 days.

(21) Appl. No.: 17/123,264

(22) Filed: Dec. 16, 2020

(65) Prior Publication Data
US 2022/0189780 A1    Jun. 16, 2022

(51) Int. Cl.
*H01L 21/285* (2006.01)
*H01L 21/02* (2006.01)
(Continued)

(52) U.S. Cl.
CPC .... *H01L 21/28581* (2013.01); *H01L 21/0217* (2013.01); *H01L 21/3215* (2013.01); *H01L 29/1066* (2013.01); *H01L 29/2003* (2013.01); *H01L 29/205* (2013.01); *H01L 29/47* (2013.01); *H01L 29/66462* (2013.01); *H01L 29/7786* (2013.01)

(58) Field of Classification Search
CPC .................................................. H01L 29/1066
See application file for complete search history.

(56) References Cited

U.S. PATENT DOCUMENTS 10,269,947 B1 * 4/2019 Moens .................. H01L 29/205
10,283,630 B2 * 5/2019 Benkhelifa ......... H01L 29/1075
(Continued)

OTHER PUBLICATIONS

Shi, YT., Ren, FF., Xu, WZ. et al. Realization of p-type gallium nitride by magnesium ion implantation for vertical power devices. Sci Rep 9, 8796 (2019). https://doi.org/10.1038/s41598-019-45177-0.*

(Continued)

*Primary Examiner* — Yara B Green
*Assistant Examiner* — Fakeha Sehar
(74) *Attorney, Agent, or Firm* — Abel Schillinger, LLP

(57) ABSTRACT

A process to form a HEMT can have a gate electrode layer that initially has a plurality of spaced-apart doped regions. In an embodiment, any of the spaced-apart doped regions can be formed by depositing or implanting p-type dopant atoms. After patterning, the gate electrode can include an n-type doped region over the p-type doped region. In another embodiment a barrier layer can underlie the gate electrode and include a lower film with a higher Al content and thinner than an upper film. In a further embodiment, a silicon nitride layer can be formed over the gate electrode layer and can help to provide Si atoms for the n-type doped region and increase a Mg:H ratio within the gate electrode. The HEMT can have good turn-on characteristics, low gate leakage when in the on-state, and better time-dependent breakdown as compared to a conventional HEMT.

20 Claims, 5 Drawing Sheets

(51) Int. Cl.
*H01L 21/3215* (2006.01)
*H01L 29/10* (2006.01)
*H01L 29/20* (2006.01)
*H01L 29/205* (2006.01)
*H01L 29/47* (2006.01)
*H01L 29/66* (2006.01)
*H01L 29/778* (2006.01)

(56) References Cited

U.S. PATENT DOCUMENTS

| | | | | |
|---|---|---|---|---|
| 10,411,125 | B2* | 9/2019 | Teo | H01L 29/365 |
| 10,797,153 | B2 | 10/2020 | Banerjee et al. | |
| 10,797,168 | B1 | 10/2020 | Moens et al. | |
| 11,121,230 | B2* | 9/2021 | Chen | H01L 29/207 |
| 2006/0138456 | A1* | 6/2006 | Parikh | H01L 29/7783 |
| | | | | 257/E29.253 |
| 2009/0072272 | A1* | 3/2009 | Suh | H01L 29/66462 |
| | | | | 257/E21.409 |
| 2010/0258841 | A1* | 10/2010 | Lidow | H01L 29/66462 |
| | | | | 257/192 |
| 2010/0258843 | A1* | 10/2010 | Lidow | H01L 29/66462 |
| | | | | 257/E21.403 |
| 2012/0313106 | A1* | 12/2012 | He | H01L 29/1066 |
| | | | | 257/E29.081 |
| 2013/0082276 | A1* | 4/2013 | Park | H01L 29/7787 |
| | | | | 257/E21.403 |
| 2014/0091363 | A1* | 4/2014 | Jeon | H01L 29/7786 |
| | | | | 257/194 |
| 2015/0263154 | A1* | 9/2015 | Fujimoto | H01L 29/7786 |
| | | | | 438/172 |
| 2016/0056245 | A1* | 2/2016 | Kinoshita | H01L 29/8086 |
| | | | | 438/191 |
| 2016/0141404 | A1* | 5/2016 | Tsai | H01L 29/66462 |
| | | | | 438/172 |
| 2016/0351684 | A1* | 12/2016 | Chiu | H01L 29/7848 |
| 2019/0035910 | A1* | 1/2019 | Moens | H01L 21/266 |
| 2019/0051732 | A1* | 2/2019 | Stoffels | H01L 29/2003 |
| 2019/0229203 | A1* | 7/2019 | Iucolano | H01L 29/778 |
| 2019/0334021 | A1* | 10/2019 | Coppens | H01L 29/7786 |
| 2020/0111891 | A1* | 4/2020 | Chen | H01L 21/0254 |

OTHER PUBLICATIONS

Shi, YT., Ren, FF., Xu, WZ. et al. Realization of p-type gallium nitride by magnesium ion implantation for vertical power devices. Sci Rep 9, 8796 (2019).*
J. Chen, H. Wakabayashi, K. Tsutsui, H. Iwai, K. Kakushima, Poly-Si gate electrodes for AlGaN/GaN HEMT with high reliability and low gate leakage current, Microelectronics Reliability, vol. 63.*
Jaud, A., Auvray, L., Kahouli, A., Abi-Tannous, T., Cauwet, F., Ferro, G. and Brylinski, C. (2017), Highly Mg-doped GaN dots and films grown by VLS transport at low temperature. Phys. Status Solidi A, 214: 1600428. https://doi.org/10.1002/pssa.201600428.*
S.P. Murarka, Silicon Dioxide, Nitride and Oxynitride, in Encyclopedia of Materials: Science and Technology, 2003 (Year: 2003).*
Shi, YT., Ren, FF., Xu, WZ. et al. Realization of p-type gallium nitride by magnesium ion implantation for vertical power devices. Sci Rep 9, 8796 (2019) (Year: 2019).*
Bayram, et al.; "Delta-Doping Optimization for High Quality P-Type GaN"; J. of App. Phys.; 104, 083512; pp. 083512-1 to 083512-5 (2008).
Wolf, S. and Tauber, R; Silicon Processing for the VLSI Era, vol. 1: Process Technology; Lattice Press, p. 369 (1986).
Jakiela, R. et al.; "Si Diffusion in Epitaxial GaN"; Phys. Stat. Sol. No. 6, pp. 1416-1419 (2006).
Wasa, K. et al.; Handbook of Sputter Deposition Technology, Fundamentals and Applications for Functional Thin Films, Nanomaterials, and MEMS, Second Edition; Elsevier; p. 302 (2012).
Ereztech; MgCp2 Data Sheet; Ereztech, LLC; pp. 1-5; generated from the Wayback Machine, webpage dated Sep. 26, 2020.

* cited by examiner

PROCESS OF FORMING AN ELECTRONIC DEVICE INCLUDING A DOPED GATE ELECTRODE

FIELD OF THE DISCLOSURE

The present disclosure relates to electronic devices and processes, and more particularly to, electronic devices including doped gate electrodes and processes of forming the same.

RELATED ART

High electron mobility transistors can have a p-type doped GaN (p-GaN) gate electrode. A gate interconnect may make an ohmic contact or a Schottky contact to the p-GaN gate electrode. The ohmic contact can result in high gate current and its failure mode is typically thermal, as a p-i-n diode that includes the p-GaN, an AlGaN barrier layer, and a GaN channel layer is forward biased. The Schottky contact has worse control over the gate that can be experienced as a worse sub-threshold slope and gate turn-on. The failure mode of the Schottky contact is a defect and depends on the quality of the Schottky interface. Accordingly, skilled artisans would like to have a process that achieves good gate turn-on characteristics, low gate leakage when the transistor is in the on-state, and a good time-dependent dielectric breakdown gate lifetime when the transistor is in the on-state.

BRIEF DESCRIPTION OF THE DRAWINGS

Embodiments are illustrated by way of example and are not limited in the accompanying figures.

Figure 1:
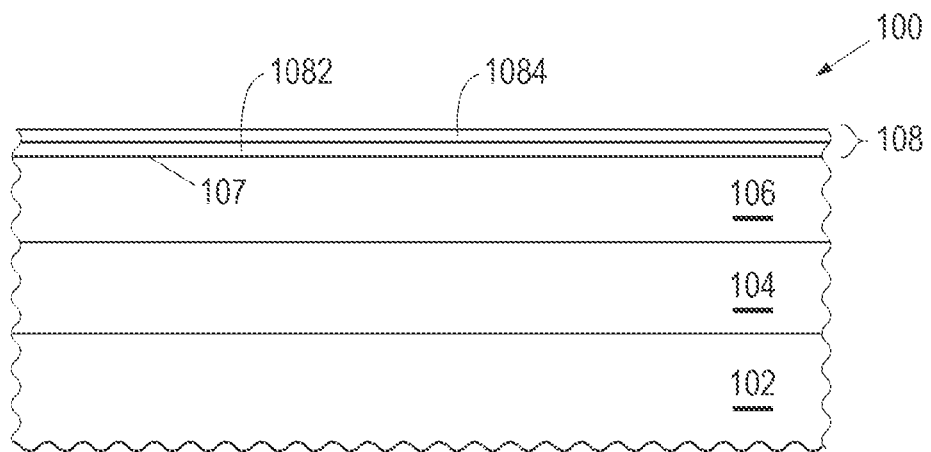
FIG. 1 includes an illustration of a cross-sectional view of a portion of a workpiece including a substrate, a buffer layer, a channel layer, and a barrier layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

A III-V material is intended to mean a material that includes at least one Group 13 and at least one Group 15 element. A III-N material is intended to mean a semiconductor material that includes at least one Group 13 element and nitrogen.

A boundary between a particular doped region and an adjacent doped region is (1) at a pn junction or (2) when the particular doped region and adjacent doped region have a common dopant, along a line where the dopant concentration for the common dopant is 1.3 times an average dopant concentration for the common dopant within the doped region having the lower average dopant concentration. Using an equation, $$C_{boundary} = 1.3 \times C_{av}, \text{ where:}$$

$C_{boundary}$ is the dopant concentration of the common dopant corresponding to the boundary between the particular doped region and the adjacent doped region, and $C_{av}$ is the average dopant concentration for the common dopant within the doped region having the lower dopant concentration.

The term "semiconductor base material" refers to the principal material within a semiconductor substrate, region, layer, or film, and does not refer to any dopant within the semiconductor substrate, region, layer, or film. A boron-doped Si layer has Si as the semiconductor base material, and a C-doped GaN layer has GaN as the semiconductor base material.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A process to form a high electron mobility transistor (HEMT) can have a gate electrode layer that initially has a plurality of spaced-apart doped regions. In an embodiment, any of the spaced-apart doped regions can be formed by depositing or implanting p-type dopant atoms. After patterning, the gate electrode can include an n-type doped region over the p-type doped region. In the same or another embodiment, a barrier layer can underlie the gate electrode and include a lower film with a higher Al content and thinner than an upper film. A silicon nitride layer can be formed over the gate electrode layer and can help to provide Si atoms for an n-type doped region and increase a Mg:H ratio within the gate electrode. The HEMT can have good turn-on characteristics, low gate leakage when in the on-state, and better time-dependent breakdown as compared to a conventional HEMT.

In an aspect, a process of forming an electronic device can include forming a first film of a gate electrode layer, wherein the first film includes a III-V material; forming a first dopant region of the gate electrode layer, wherein the first dopant region has a first conductivity type; forming a second film of the gate electrode layer overlying the first film of the gate electrode layer, wherein the second film includes a III-V material, and forming a second dopant region of the gate electrode layer, wherein the second dopant region overlies the first dopant region and has the first conductivity type.

In another aspect, an electronic device can include a channel layer having a major surface; and a gate electrode overlying the channel layer. A first portion of the gate electrode can include a first dopant having a first conductivity type, the first portion of the gate electrode can have a first dopant concentration profile in a direction substantially perpendicular to the major surface, and the first concentration profile can have at least two peak dopant concentrations.

In a further aspect, an electronic device can include a channel layer having a major surface; and a gate electrode overlying the channel layer and including a first portion and a second portion. The first portion of the gate electrode can be disposed between the channel layer and the second portion of the gate electrode, the first portion of the gate electrode can be undoped or has an average dopant concentration of at most $5\times10^{16}$ atoms/cm$^3$, and the second portion of the gate electrode can include a first dopant having a first conductivity type.

FIG. 1 includes a cross-sectional view of a portion of a workpiece 100 that can include a substrate 102, a buffer layer 104, a channel layer 106, and a barrier layer 108. The substrate 102 can include silicon, sapphire (monocrystalline $Al_2O_3$), silicon carbide (SiC), aluminum nitride (AlN), gallium oxide ($Ga_2O_3$), spinel ($MgAl_2O_4$), coefficient of thermal expansion matched laminated material, another suitable substantially monocrystalline material, or the like. The selection of the particular material and crystal orientation along the primary surface can be selected depending upon the composition of the overlying semiconductor layers.

The buffer layer 104 can include a III-N material, and in a particular embodiment, can include $Al_aGa_{(1-a)}N$, where $0 \leq a \leq 1$. The composition of the buffer layer 104 may depend on the composition of the semiconductor base material of the channel layer 106 and the designed operating voltage of the HEMT. The composition of the buffer layer 104 can be changed as a function of thickness, such that the buffer layer 104 has a relatively greater aluminum content closer to the substrate 102 and relatively greater gallium content closer to the channel layer 106. In a particular embodiment, the cation (metal atoms) content in the semiconductor base material of the buffer layer 104 near the substrate 102 can be 10 atomic % to 100 atomic % Al with the remainder Ga, and the cation content in the semiconductor base material of the buffer layer 104 near the channel layer 106 can be 0 atomic % to 50 atomic % Al with the remainder Ga. In another embodiment, the buffer layer 104 can include a plurality of films. The buffer layer 104 can have a thickness in a range from approximately 1 micron to 6 microns. The buffer layer 104 can be doped with a p-type dopant element such as carbon or iron.

The channel layer 106 has a major surface 107 and can include $Al_zGa_{(1-z)}N$, where $0 \leq z \leq 0.1$ and have a thickness in a range from approximately 10 nm to 4000 nm. In a particular embodiment, the channel layer 106 is a GaN layer (z=0). The channel layer 106 may be undoped or unintentionally doped or doped with an electron donor (n-type) dopant or an electron acceptor (p-type) dopant. A high density two-dimensional electron gas (2DEG) can be formed near portions of the interface of the channel layer 106 and the barrier layer 108 and is responsible for high mobility and lower resistivity of the transistor structure when in the on-state. In an enhancement-mode HEMT, a 2DEG may not be present under the gate structure when the HEMT is in an off-state. Any reduction of the 2DEG electrons will increase the on-resistance of the transistor. In an embodiment, the concentration of p-type dopant or n-type dopant may be kept as low as reasonably possible.

In a particular embodiment, p-type dopant can include carbon from a source gas (e.g., $Ga(CH_3)_3$) when metalorganic chemical vapor deposition (MOCVD) is used to form the channel layer 106. In a particular embodiment, the lowest trap concentration is desired but may be limited by growth or deposition conditions and purity of the precursors. Thus, some carbon can become incorporated as the channel layer 106 is grown, and such carbon can result in unintentional doping. The carbon content may be controlled by controlling the deposition conditions, such as the deposition temperature, pressure, and flow rates. In another embodiment the p-type dopant such as carbon can incorporated from dedicated source gas such as an alkane, for example, $C_nH_{2n+2}$, where n is 1 to 6. In an embodiment, the channel layer 106 has a carrier impurity concentration that is greater than 0 and at most $5\times10^{16}$ atoms/cm$^3$. In a particular embodiment, the carrier impurity concentration is in a range from $1\times10^{15}$ atoms/cm$^3$ to $1\times10^{16}$ atoms/cm$^3$.

In an embodiment, the channel layer 106 has a thickness that is at least 50 nm. When the thickness is less than 50 nm, a 2DEG may be more difficult to generate, maintain, or both. In the same or another embodiment, the channel layer 106 has a thickness that is at most 5000 nm. In a particular embodiment, the thickness in a range from 50 nm to 300 nm can provide sufficiently thick channel layer 106 to allow for the proper generation and maintaining of the 2DEG and still obtain a reasonable value for Rdson. Although not illustrated, a spacer layer may be used between the channel and barrier layers 106 and 108 if desired.

The barrier layer 108 can include a III-V semiconductor base material, such as a III-N semiconductor base material. In an embodiment, the barrier layer 108 can have a thickness of at least 8 nm, at least 12 nm, or at least 15 nm, and in the same or another embodiment, the barrier layer 108 can have a thickness of at most 30 nm, at most 25 nm, or at most 22 nm. In an embodiment, the barrier layer 108 can be undoped or unintentionally doped. Thus, the barrier layer 108 may have any of the carrier impurity concentrations as previously described with respect to the channel layer 106. The barrier layer 108, and any film within the barrier layer 108, may have a carrier impurity concentration that is the same or different as compared to the channel layer 106.

The barrier layer 108 can include at least one film. For example, the barrier layer 108 can include a lower film 1082 and an upper film 1084, wherein each of the lower and upper films 1082 and 1084 can include $Al_xIn_yGa_{(1-x-y)}N$, wherein $0<x\leq1$, $0\leq y\leq0.5$, and $(x+y)\leq1$. In an embodiment, the lower film 1082 can have a higher Al content and be thinner as compared to the upper film 1084. In a particular embodiment, the lower film 1082 can include $Al_xGa_{(1-x)}N$, wherein $0<x\leq0.5$, and the upper film 1084 can include $Al_xGa_{(1-x)}N$, wherein $0<x\leq0.3$. In a non-limiting embodiment, the lower film 1082 may have a thickness in a range from 5 nm to 8 nm, and the upper film 1084 may have a thickness in a range from 5 nm to 15 nm. Other compositions and thicknesses may be used without deviating from the concepts as described herein.

In the same or another embodiment (not illustrated), the barrier layer 108 may include a further film overlying the upper film 1084. The further film can include $Al_xIn_yGa_{(1-x-y)}N$, wherein $0<x\leq1$, $0\leq y\leq0.5$, and $(x+y)\leq1$. The further film may be an etch-stop film when etching through a portion, and not all, of the thickness of the barrier layer 108. Thus, in an embodiment, the further film has a different composition as compared to the upper film 1084. The further film can have any of the thicknesses as previously described with respect to the lower film 1082. The further film may have the same or different composition and the same or different thickness as compared to the lower film 1082.

The buffer layer 104, the channel layer 106, and barrier layer 108 can be formed using an epitaxial growth technique, and thus, the barrier layer 108, the channel layer 106, and at least a portion of the buffer layer 104 can be monocrystalline. In a particular embodiment, metal-containing films can be formed using metalorganic chemical vapor deposition.

Figure 2:
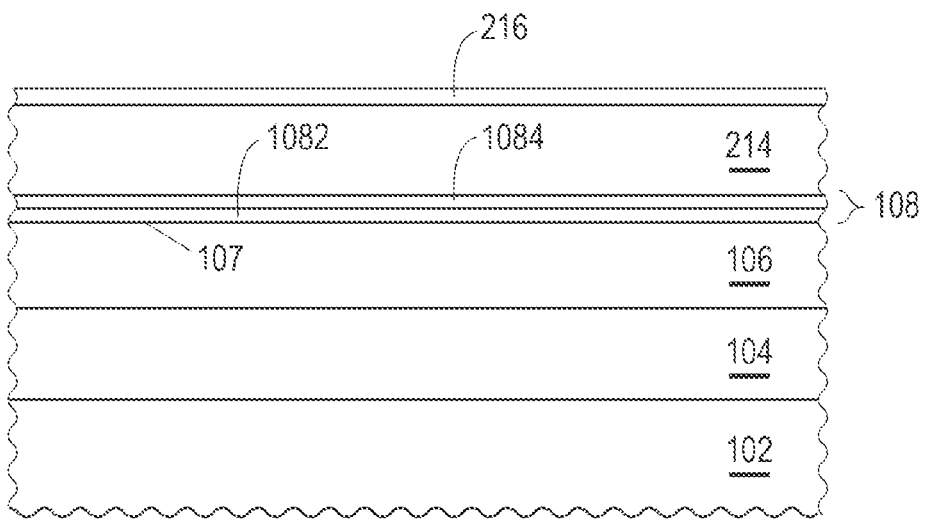
FIG. 2 includes an illustration of a cross-sectional view of the workpiece of FIG. 1 after forming a film and dopant region for a gate electrode layer.

A gate electrode layer can be formed in stages to obtain a desired initial doping profile. In an embodiment illustrated in FIG. 2, a lowest film 214 is formed over the barrier layer 108. The lowest film 214 can include $Al_cGa_{(1-c)}N$, wherein $0\leq c\leq1$. In an embodiment, the thickness of the lowest film 214 can be at least 3 nm or at least 5 nm, and in the same or another embodiment, the thickness is at most 25 nm, at most 20 nm, or at most 15 nm. The lowest film 214 can be undoped or unintentionally doped. The lowest film 214 can have any of the dopant concentrations as described with respect to the channel layer 106. The lowest film 214 can have the same or different dopant concentration as compared to channel layer 106. In a particular embodiment, the dopant within the lowest film as formed is C.

A p-type dopant region 216 is introduced after forming the lowest film 214. The p-type dopant can be Mg. In an embodiment, Mg can be formed over the lowest film 214. In a particular embodiment, a deposition, such as metalorganic chemical vapor deposition (MOCVD) can be used to form each of the layers. The Mg precursor used in the MOCVD can include Mg, C, and H atoms and may not include a different metal or O atom. In another particular embodiment, bis(cyclopentadienyl)Mg, hereinafter referred to as "$MgCp_2$," can be used as a Mg source. In another embodiment, a different Mg precursor can be used. In a particular embodiment, $H_2$ can be used as a carrier gas to introduce $MgCp_2$ into a reaction chamber having the workpiece including the lowest film 214. The $MgCp_2$ decomposes to form Mg atoms along the exposed surface of the lowest film 214. In a non-limiting embodiment, spaced-apart droplets including the Mg atoms can form along the exposed surface of the lowest film 214.

Figure 3:
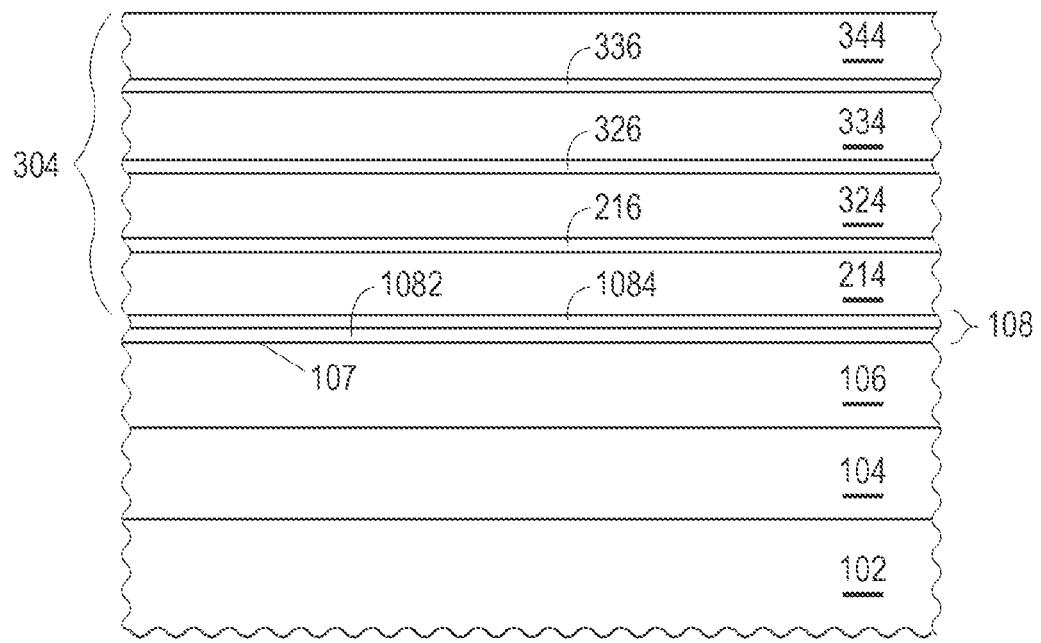
FIG. 3 includes an illustration of a cross-sectional view of the workpiece of FIG. 2 after forming remaining films and dopant regions for the gate electrode layer.

The process of forming films and dopant regions can be iterated until a desired thickness of the gate electrode layer 304 is achieved. In the embodiment of FIG. 3, the gate electrode layer 304 includes additional films 324, 334, and 344, and p-type dopant regions 326 and 336. Each of the films 324, 334, and 344 can have any of the compositions and thicknesses as previously described with respect to the lowest film 214. In an embodiment, the films 214, 324, 334, and 344 can have substantially the same composition, and in another embodiment, any one of the films 214, 324, 334, and 344 can have a different composition as compared to any one or more of the other films. In an embodiment, the films 214, 324, 334, and 344 can have substantially the same thickness, and in another embodiment, any one of the films 214, 324, 334, and 344 can have a different thickness as compared to any one or more of the other films.

Each of the p-type dopant regions 326 and 336 can be doped using any of the doping techniques as previously described with respect to the p-type dopant region 216. In an embodiment, the p-type dopant regions 216, 326, and 336 can be doped using the same doping technique or different doping techniques.

Each of the films 214, 324, 334 and 344 can be formed using any of the techniques as described with respect to the channel layer 106. Each of films 214, 324, 334, and 344 can be formed using the same technique or different techniques as compared to any other film within the gate electrode layer 304.

Figure 4:
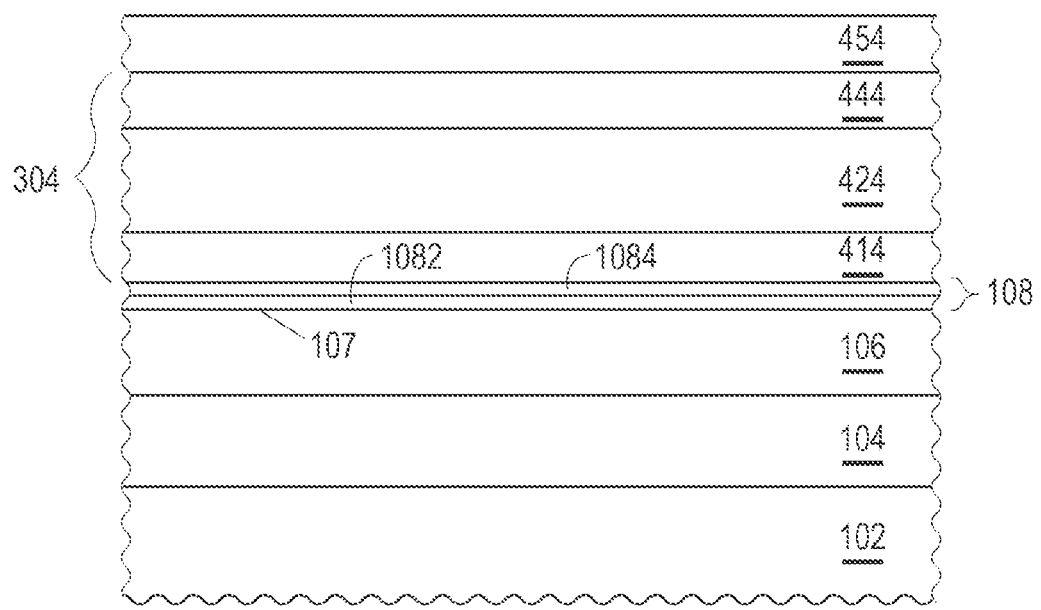
FIG. 4 includes an illustration of a cross-sectional view of the workpiece of FIG. 3 after forming a dielectric film over the gate electrode layer and diffusing dopant within the gate electrode layer.

A dielectric layer 454 is formed over the gate electrode layer 304, as illustrated in FIG. 4. In an embodiment, the dielectric layer 454 is a silicon nitride layer that can be formed using a silicon-containing gas and a nitrogen-containing source gas. In an embodiment, the silicon-containing gas can include $SiH_4$, $SiH_3Cl$, $SiH_2Cl_2$, $SiHCl_3$, or the like, and the nitrogen-containing gas can include $NH_3$, $N_2$, $N_2O$, $N_2H_4$, or the like. In a particular embodiment, $SiH_4$ and $NH_3$ can be used as source gases, and the deposition can be performed at a temperature of at least 750° C. to form $Si_3N_4$.

Some of the Si during formation of or from the silicon nitride during subsequent thermal processing can enter the uppermost film 344 (FIG. 3) of the gate electrode and make an n-type doped region 444 (FIG. 4) from at least a portion of the uppermost film 344. In an embodiment, the n-type doped region 444 can have a highest dopant concentration of at least $1\times10^{17}$ atoms/cm$^3$, at least $1\times10^{18}$ atoms/cm$^3$, or at least $1\times10^{19}$ atoms/cm$^3$, and in the same or another embodiment, the n-type doped region 444 can have a highest dopant concentration of at most $1\times10^{20}$ atoms/cm$^3$, at most $5\times10^{19}$ atoms/cm$^3$, or at most $2\times10^{19}$ atoms/cm$^3$.

The p-type dopant within the p-type dopant regions 216, 326, and 336 within the gate electrode layer 304 can diffuse so that the spaced-apart p-type dopant regions 216, 326, and 336 merge together to form a diffused p-type doped region 424. The diffusion may occur during formation of the dielectric layer 454 or may occur during a separate thermal cycle before or after the dielectric layer 454 is formed. In a particular embodiment, the diffusion may occur during thermal cycles for the remainder fabrication process without the need to add a separate, dedicated thermal cycle. After reading this specification, skilled artisans will be able to determine an acceptable thermal budget to achieve a desired dopant concentration within the HEMT. In a particular embodiment, when the p-type dopant is Mg, the highest Mg concentration within the diffused p-type doped region 424 may be at least one or two decades higher than the Mg concentration within the barrier layer 108 along the interface with the channel layer 106. Simulations or empirical data can be generated to determine a thermal budget for a particular application.

In an embodiment, the p-type doped region 424 can have a highest dopant concentration of at least $1\times10^{18}$ atoms/cm$^3$, at least $5\times10^{18}$ atoms/cm$^3$, or at least $1\times10^{19}$ atoms/cm$^3$, and in the same or another embodiment, the p-type doped region 424 can have a highest dopant concentration of at most $1\times10^{20}$ atoms/cm$^3$, at most $7\times10^{19}$ atoms/cm$^3$, or at most $5\times10^{19}$ atoms/cm$^3$.

Figure 5:
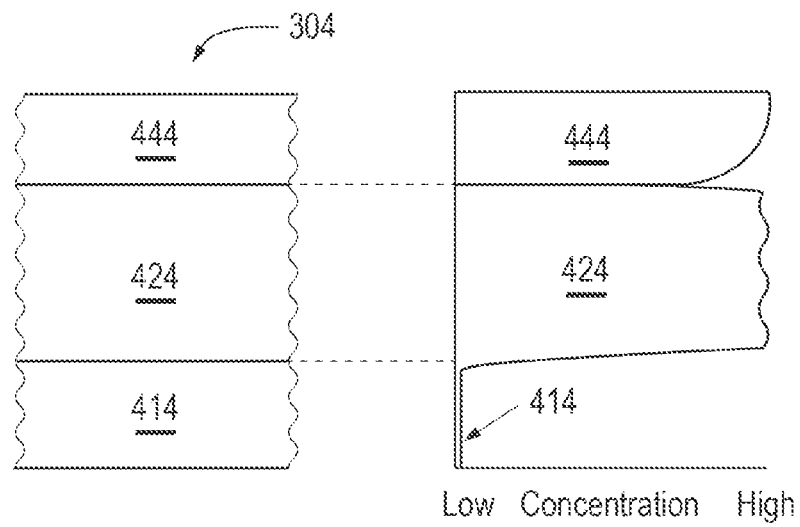
FIG. 5 includes an illustration of a cross-sectional view of a portion of the gate electrode layer in FIG. 4 and a dopant concentration profile.

FIG. 5 illustrates a portion of the gate electrode layer 304 and a dopant concentration profile in a direction perpendicular to the major surface 107 of the channel layer 106. In the embodiment as illustrated in FIG. 5, the dopant concentration profile has the Mg concentration profile for the p-type doped region 424 and Si concentration for the n-type doped region 444. The concentration profile can have locally higher regions of Mg concentrations corresponding to the originally-formed p-type dopant regions 216, 326, and 336. Although the dopant concentrations at the peaks are substantially the same, they may be different. For example, less p-type dopant may be used for p-type dopant region 216 or 336. Thus, the peak dopant concentration corresponding to the p-type dopant region 326 may be higher than the peak dopant concentration corresponding to either or both of the p-type dopant regions 216 and 336. The Si concentration can be highest along the upper surface of the gate electrode layer 304. In an embodiment, a portion 414 of the gate electrode layer 304 can be undoped or unintentionally doped, and such portion 414 can correspond to part of the lowermost film 214 where the Mg concentration is insignificant as compared to the p-type doped region 424. A different Mg concentration profile for the gate electrode layer 304 may be achieved and depends on the dopant technique used to introduce Mg into the gate electrode layer 304.

Figure 6:
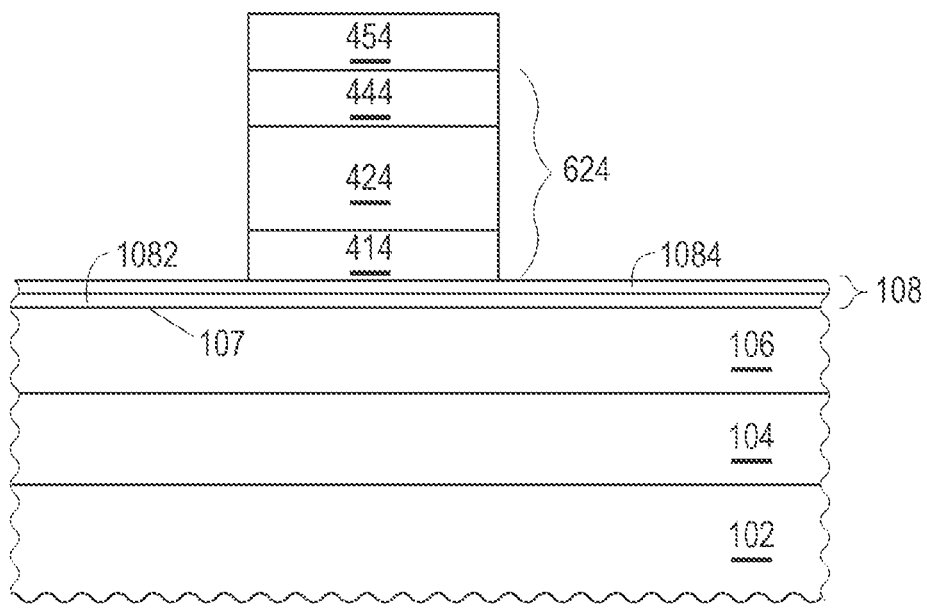
FIG. 6 includes an illustration of a cross-sectional view of the workpiece of FIG. 3 after patterning the gate electrode layer and the dielectric layer in forming a gate electrode.

A mask is formed over the dielectric layer 454, and an etch is performed to pattern the dielectric layer 454 and the gate electrode layer 304. The etch stops on or within the barrier layer 108. The etch can be performed using endpoint detection, a timed etch, or endpoint detection within a timed overetch. In FIG. 6, the gate electrode 624 corresponds to the patterned gate electrode layer 304.

Figure 7:
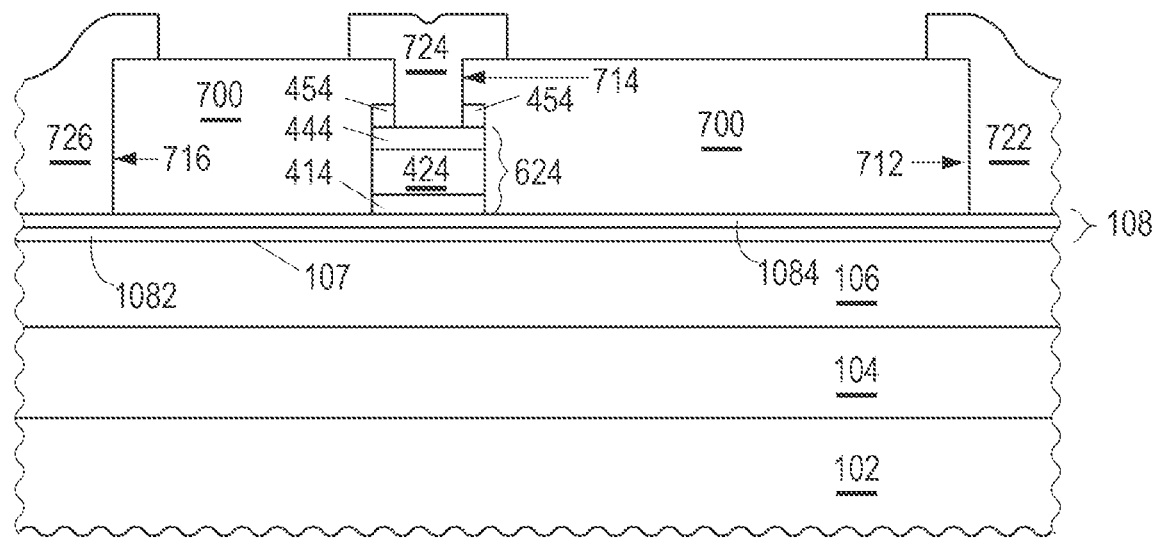
FIG. 7 includes an illustration of a cross-sectional view of a substantially completed high electron mobility transistor in accordance with an embodiment.

FIG. 7 illustrates the workpiece after forming an interlevel dielectric (ILD) layer 700, a drain electrode 722 within a contact opening 712, a gate interconnect 724 within a contact opening 714, and a source electrode 726 within a contact opening 716. The ILD layer 700 can be formed over the dielectric layer 454. The ILD layer 700 can include a single film or a plurality of films. The single film or each of the films can include an oxide, a nitride, or an oxynitride. The ILD layer 700 can have a thickness in a range from 20 nm to 2000 nm.

As illustrated in FIG. 7, the contact openings 712 and 716 for the drain and source electrodes 722 and 726 extend through the ILD layer 700. The contact openings 712 and 716 can land on the upper film 1084 of the barrier layer 108 (as illustrated in FIG. 7), extend partly, but not completely, through the upper film 1084, land on the lower film 1082 of the barrier layer 108, extend partly, but not completely, through the lower film 1082, land on the channel layer 106, or extend partly, but not completely, through the channel layer 106. After reading this specification, skilled artisans will be able to determine depths of the contact openings 712 and 716 for the drain and source electrodes 722 and 726 to achieve a desired combination of sheet resistance under the drain and source electrodes 722 and 726 and contact resistance between the drain and source electrodes 722 and 726 and the underlying films.

The contact opening 714 for the gate interconnect 724 extends through the ILD layer 700 and the dielectric layer 454 to expose the gate electrode 624. The bottom of the contact opening 714 can contact the n-type doped region 444 of the gate electrode 624. In an embodiment, the contact opening 714 may be laterally offset from one or both upper corners of the gate electrode 624. In another embodiment, the contact opening 714 may be aligned to one or both of the top corners of the gate electrode 624.

A conductive layer is formed over the ILD layer 700 and within the contact openings 712, 714, and 716. The conductive layer can include a single film or a plurality of films. In an embodiment, the conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 50 nm to 4000 nm and, in a more particular embodiment, in a range from 90 nm to 2000 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices. The conductive layer is patterned to form the drain electrode 722, the gate interconnect 724, and the source electrode 726.

The gate interconnect 724 may be formed at the same or a different interconnect level as compared to the drain and source electrodes 722 and 726. Furthermore, the gate interconnect 724 can have substantially the same or a different composition as compared to drain and source electrodes 722 and 726.

The drain and source electrodes 722 and 726 can make ohmic contacts to the barrier layer 108. In an embodiment, the gate interconnect 724 can make a Schottky contact to the gate electrode 624. The Schottky contact can help to keep gate leakage lower as compared to an ohmic contact between a conventional p-GaN gate electrode and a gate interconnect. In another embodiment, the gate interconnect 724 can make an ohmic contact to the gate electrode 624. The ohmic contact can allow for a relatively steep sub-threshold slope (in a plot of drain current (ID) versus gate voltage ($V_{GS}$)) and good turn-on characteristics as compared to a Schottky contact between a conventional p-GaN gate electrode and a gate interconnect. The junction between the p-type doped region 424 and n-type doped region 444 in the gate electrode 624 helps to keep the gate leakage current relatively low as compared to an ohmic contact between a conventional p-GaN gate electrode and a gate interconnect.

One or more additional interconnect levels and a passivation layer may be formed over the workpiece. Each interconnect level can include an ILD layer and interconnects. For example, one or more of the interconnects can include a shield electrode to help control electrical fields within the HEMT. A conductive layer can be used at each interconnect level. The conductive layer may be the same or different from the other conductive layers described earlier in this specification. A substantially completed electronic device has been formed. One or more of the interconnect levels can include shield electrodes if needed or desired.

Different embodiments can be used without deviating from the concepts described herein. As previously discussed, the p-type dopant regions 216, 326, and 336 can be formed by depositing layers of Mg atoms. In another embodiment, a different number of films, a different number of p-type dopant regions, or both may be used. For example, more films and more p-type dopant regions can be used. For the same thickness for the gate electrode layer 304, each of the films may be thinner, and each of the p-type dopant regions may have one or fewer layers of Mg atoms. Simulations or empirical data can be generated to achieve a desired dopant concentration profile for the gate electrode layer 304.

In another embodiment, the p-type dopant regions within the gate electrode layer can be introduced into the gate electrode layer after forming the full thickness of the gate electrode layer. In a particular embodiment, the gate electrode layer can be formed using a single III-N film having any of the semiconductor base materials previously described for the lowermost film 214. In an embodiment, the thickness of the single film can be at least 40 nm, at least 60 nm, or at least 80 nm, and in the same or another embodiment the thickness of the single layer can be at most 500 nm, at most 250 nm, or at most 120 nm. Ions can be implanted at different energies to achieve p-type dopant regions similar to the p-type dopant regions 216, 326, and 336. The dielectric layer 454 may be present during ion implantation to reduce the likelihood of implant channeling. Similar to a prior embodiment, more or fewer ion implantations at different energies may be performed. Simulations or empirical data can be generated to determine the number of ion implantations and an energy and dose for each ion implantation needed or desired for a particular application.

Depositing layers of p-type dopant atoms may be more advantageous as compared to implanting p-type dopant ions. The amount of crystal damage may be less for the deposited layers of p-type dopant atoms as compared to doping using ion implantation because ions may hit some of the atoms within the gate electrode layer and result in broken bonds or vacancies.

Further, the gate electrode layer 304, including the deposited layers of p-type dopant atoms, can be formed without breaking vacuum, and thus, the interfaces between films 214, 324, 334, and 344 and their corresponding p-type dopant regions 216, 326, and 336 are less likely to have contaminants introduced when forming the gate electrode layer 304. For ion implantation performed after forming different films of the gate electrode layer, the workpieces need to be moved from a deposition tool to an ion implanting tool. Typically, the workpieces will need to be taken close to atmospheric pressure (approximately 100 kPa absolute pressure) when the workpieces are moved between tools. As the number of evacuation and backfill cycles increase, the likelihood of a particle or other contaminant being introduced increases.

Unlike depositing layers of p-type dopant atoms, ion implantation has a corresponding straggle ($\Delta R_p$) for each energy. Thus, for ion implantation, there is a greater likelihood that Mg atoms (within a tail of a distribution) will be implanted into the barrier layer 108 or even possibly the channel layer 106. Straggle is not an issue for the deposited layers of p-type dopant atoms. Thus, controlling the location and concentration profile for the as-implanted p-type ions within the gate electrode layer 304 may be more difficult as compared to depositing the layers of the p-type dopant atoms.

Even with the possible disadvantages, ion implantation may be used if needed or desired for a particular application.

Figure 8:
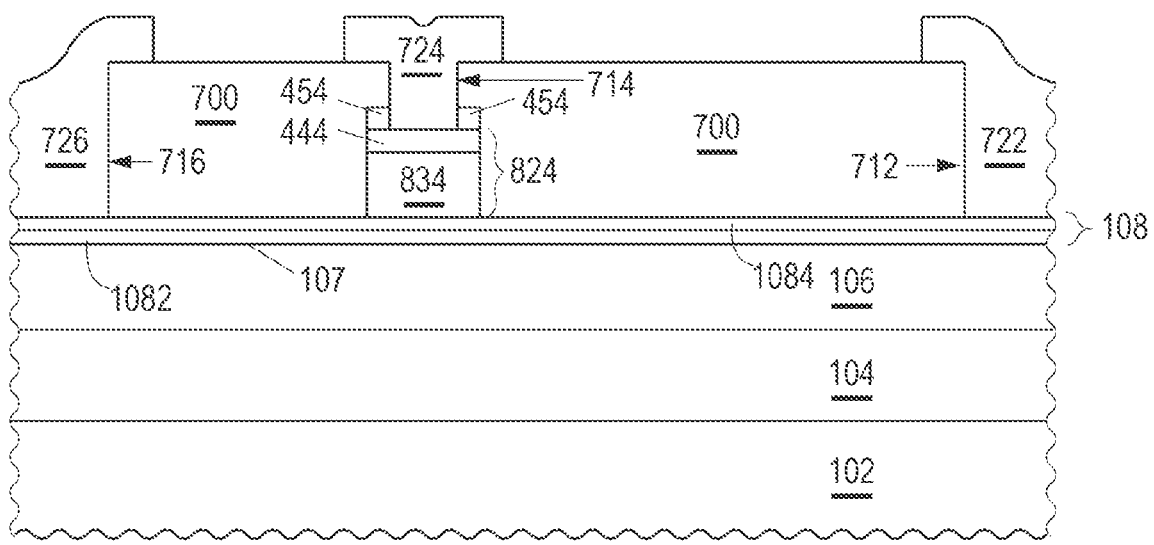
FIG. 8 includes an illustration of a cross-sectional view of a substantially completed high electron mobility transistor in accordance with another embodiment.

In a further embodiment, a p-type doped region in the gate electrode layer can extend to the barrier layer 108. FIG. 8 includes a gate electrode 824 where the p-type doped region 834 extends to the barrier layer 108. A HEMT having the gate electrode 824 will have a higher threshold voltage ($V^{th}$) as compared to the gate electrode 624. The p-type dopant can be introduced when forming a lowermost film within the gate electrode layer. Alternatively, the lowermost film 214 as described with respect to the gate electrode layer 304 may be thinner, so that the deposited layer or layers of p-type dopant atoms, as originally formed, are closer to the barrier layer 108. In a particular embodiment, the p-type doped region 834 may allow the $V^{th}$ to be higher as compared to a HEMT with the gate electrode 624. Thus, skilled artisans will be able to achieve a $V^{th}$ as needed or desired for a particular application.

In another embodiment, the n-type doped region 444 can be a Group 14 film, where the Group 14 material can be Si, SiC, Ge, or the like. From the perspective of a III-V semiconductor material (e.g., the portion of the gate electrode 624 below the n-type doped region 444), a Group 14 material appears to be an n-type doped semiconductor material whether the Group 14 material is undoped or doped with an n-type dopant using any of the dopant concentrations previously described with respect to the n-type doped region 444. An ohmic contact between the gate electrode and the gate interconnect can be formed when the polycrystalline Si film has a dopant concentration of at least $1 \times 10^{19}$ atoms/cm$^3$. A Schottky contact between the gate electrode and the gate interconnect can be formed when the polycrystalline Si film is undoped or has a dopant concentration less than $1 \times 10^{19}$ atoms/cm$^3$.

EXAMPLES

The following examples are provided to demonstrate that a HEMT having a gate electrode in accordance with an embodiment described herein can have superior time-dependent breakdown characteristics as compared to a comparative HEMT.

Comparative HEMTs have a single film barrier layer that has a composition of $Al_{0.225}Ga_{0.775}N$ and a thickness of approximately 12.5 nm. The comparative HEMTs also have a p-type GaN gate electrode where the p-type dopant within the gate electrode extends from the single film barrier layer to a gate interconnect and has an average dopant concentration of approximately $3 \times 10^{19}$ atoms/cm$^3$. The gate electrode for the comparative HEMTs does not include an n-type doped region, such as the n-type doped region 444. A Schottky contact is formed between the p-GaN gate electrode and the gate interconnect. The comparative HEMTs have a $V^{th}$ of approximately 1.4 V.

Novel HEMTs have the barrier layer 108 and the gate electrode 624. The barrier layer 108 includes a lower film and an upper film. The lower film 1082 includes $Al_{0.25}Ga_{0.75}N$ and a thickness of approximately 5 nm, and the upper film 1084 includes $Al_{0.18}Ga_{0.82}N$ and a thickness of approximately 10 nm. The gate electrode 624 was formed in a manner as previously described with respect to the deposition of p-type dopant layers using MgCp$_2$. The novel HEMTs further include the dielectric layer 454 that is a silicon nitride layer overlying the gate electrode 624. The dielectric layer 454 dopes a portion of the gate electrode 624 with an n-type dopant. The gate electrode 624 has an undoped or unintentionally doped region that is contact with the upper film 1084 of the barrier layer 108 and includes a portion of the lowermost film 214. The gate electrode 624 also includes the p-type doped region 424 that has an average dopant concentration of approximately $2 \times 10^{19}$ atoms/cm$^3$, and the n-type doped region 444 that has an average dopant concentration of approximately $1 \times 10^{19}$ atoms/cm$^3$. A Schottky contact is formed between the gate electrode 624 and the gate interconnect 724. The novel HEMTs have a $V_{TH}$ of approximately 0.9 V.

The HEMTs were subjected to time-dependent breakdown tests. Time-to-fail data were collected when VDS was approximately 400 V and ambient temperature was approximately 150° C. The comparative HEMTs had $V_{GS}$ of approximately 7.6 V, approximately 7.8 V, approximately 8.0 V, or approximately 8.5 V and were tested until they failed. The novel HEMTs had $V_{GS}$ of approximately 9.5 V, approximately 10.0 V, or approximately 11.0 V and were tested until they failed.

Figure 9:
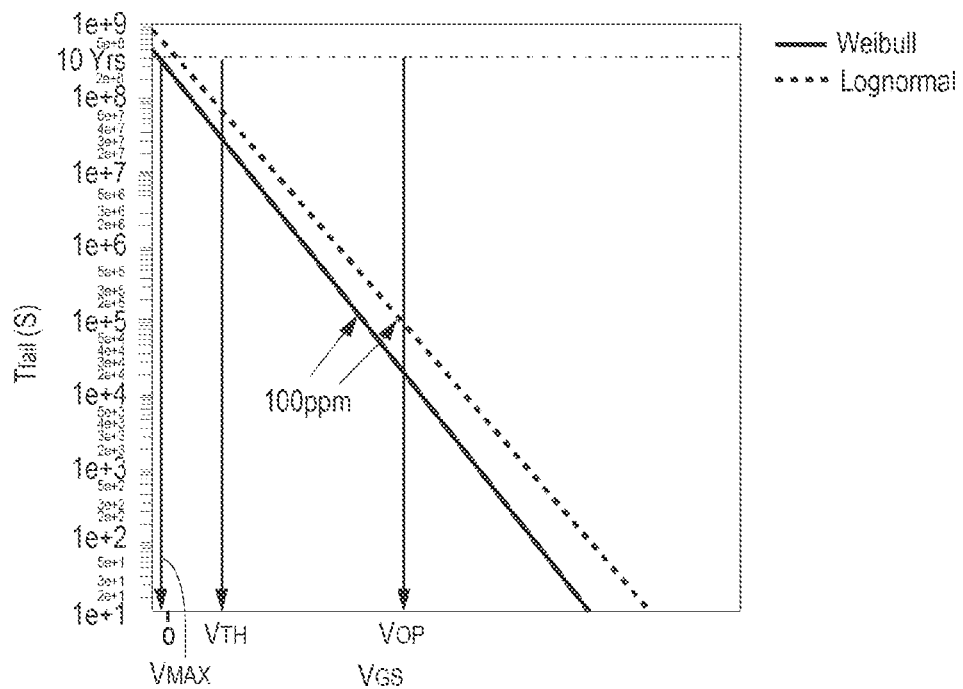
FIG. 9 includes Weibull and lognormal curves for time-to fail at a 100 ppm failure level vs. gate-to-source voltage for a comparative high electron mobility transistor.

Weibull and lognormal plots at 0.01% (100 ppm) failures (100 ppm plots) were generated from the data collected. FIG. 9 includes the Weibull and lognormal plots for the comparative HEMTs, and FIG. 10 includes the Weibull and lognormal plots for the novel HEMTs. Many customers of HEMTs expect the HEMTs to last 10 years with no more than 0.01% (100 ppm) failures. Thus, the point where the 100 ppm plots cross the 10-year point corresponds to the maximum allowable $V_{GS}$ ($V_{MAX}$ in FIGS. 9 and 10) when the HEMT is in the on-state.

In FIG. 9, the Weibull 100 ppm plot indicates that the comparative HEMT is predicted to fail in less than 10 years when $V_{GS}$ is 0 V or higher. The comparative HEMT has a $V_{TH}$ that is greater than 0 V, thus, the Weibull 100 ppm plot predicts that the comparative HEMT will fail in less than a year.

Figure 10:
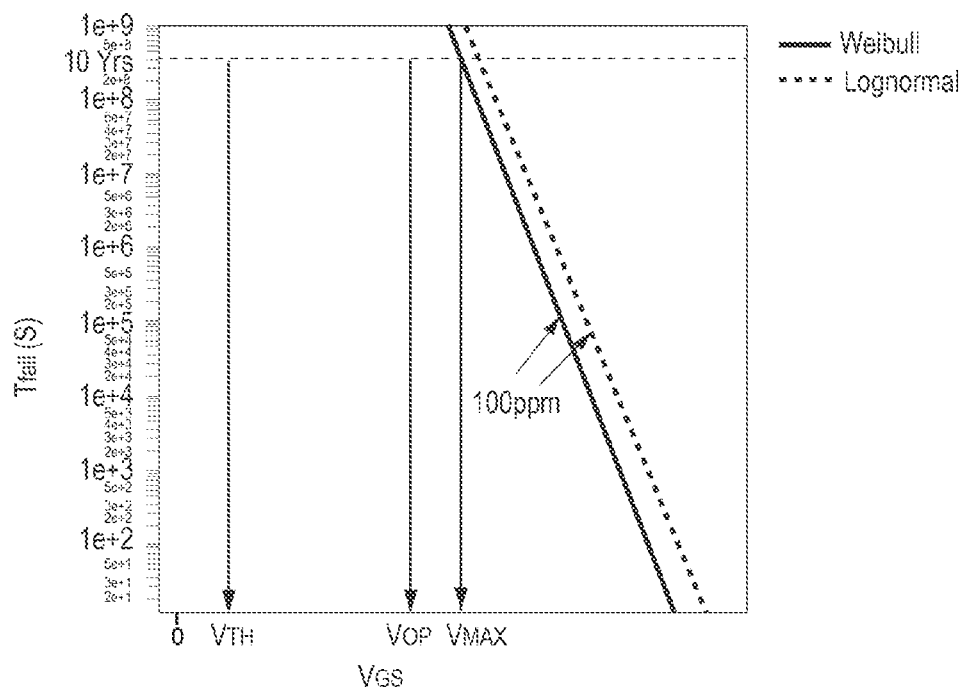
FIG. 10 includes Weibull and lognormal curves for time-to fail at a 100 ppm failure level vs. gate-to-source voltage for a high electron mobility transistor in accordance with an embodiment.

Both the $V_{TH}$ and the operating voltage (Vol)) for the novel HEMT are included in FIG. 10. $V_{OP}$ is substantially higher than $V_{TH}$. Unexpectedly, the Weibull 100 ppm plot predicts the novel HEMT will have a lifetime of over 10 years when $V_{GS}$ is at $V_{OP}$.

Embodiments as described herein allow for HEMTs and processes of forming the same that can have good turn-on characteristics, low gate current when in the on-state, and better time-dependent breakdown characteristics. The good turn-on characteristics may be in the form of a steep sub-threshold slope and can be achieved using an ohmic contact formed between the gate interconnect and the gate electrode 624 or 824. The low gate current may be achieved by the diode formed by the pn junction between the p-type doped region 424 and the n-type doped region 444. The formation of the gate electrode 624 allows the gate electrode 624 in the finished device to have fewer crystal defects as compared to a conventionally formed p-GaN gate electrode. When the dielectric layer 454 includes a silicon nitride, the gate electrode has a higher Mg:H. For example, if the silicon nitride layer is not formed, the Mg:H can be three to four times lower as compared to when the silicon nitride layer is present. Because H can deactivate Mg within a III-V material, the higher Mg:H ratio can help keep the resistivity of the p-type doped region 424 lower.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

A process of forming an electronic device can include forming a first film of a gate electrode layer, wherein the first film includes a III-V material; forming a first dopant region of the gate electrode layer, wherein the first dopant region has a first conductivity type; forming a second film of the gate electrode layer overlying the first film of the gate electrode layer, wherein the second film includes a III-V material, and forming a second dopant region of the gate electrode layer, wherein the second dopant region overlies the first dopant region and has the first conductivity type.

Embodiment 2

The process of Embodiment 1 can further include annealing the gate electrode layer or a gate electrode formed from the gate electrode layer, so that a dopant from each of the first dopant region and the second dopant region merge together to form a diffused doped region.

Embodiment 3

The process of Embodiment 2 can further include forming a channel layer having a major surface before forming the first film of the gate electrode. In a finished device, the diffused doped region can have a dopant concentration profile in a direction substantially perpendicular to the major surface, and the concentration profile has at least two peak dopant concentrations, wherein one of the at least two peak dopant concentrations corresponds to the first dopant region, and another one of the at least two peak dopant concentrations corresponds to the second dopant region.

Embodiment 4

The process of Embodiment 1, wherein forming the first dopant region includes forming spaced-apart droplets including atoms of a dopant over the first film before forming the second film.

Embodiment 5

The process of Embodiment 1, wherein forming the first dopant region or forming the second dopant region includes using a Mg precursor that includes Mg, C, and H atoms and does not include a different metal or O atom as a dopant source.

Embodiment 6

The process of Embodiment 1, wherein forming the first dopant region or forming the second dopant region includes implanting Mg into the first film or the second film of the gate electrode layer.

Embodiment 7

The process of Embodiment 1 can further include forming a third film of the gate electrode layer over the second film of the gate electrode layer, wherein in a finished device, the third film includes a dopant having a second conductivity type opposite the first conductivity type.

Embodiment 8

The process of Embodiment 1 can further include forming a third film of the gate electrode layer over the second film of the gate electrode layer, wherein the third film of the gate electrode layer is a Group 14 film.

Embodiment 9

The process of Embodiment 1 can further include forming a silicon nitride layer over the first film and the second film of the gate electrode layer, wherein some Si during formation of or from the silicon nitride layer migrates into the gate electrode layer to form a Si-doped region within the gate electrode layer.

Embodiment 10

The process of Embodiment 1 can further include patterning the gate electrode layer to form a gate electrode; and forming a gate interconnect contacting a surface of the gate electrode layer to form a Schottky contact.

Embodiment 11

The process of Embodiment 1 can further include patterning the gate electrode layer to form a gate electrode; and forming a gate interconnect contacting a surface of the gate electrode layer to form an ohmic contact.

Embodiment 12

The process of Embodiment 1 can further include forming a first film of a barrier layer; and forming a second film of the barrier layer. Forming the second film of the barrier layer can be performed after forming the first film of the barrier layer and before forming the first film of the gate electrode layer. The first film of the barrier layer can have a higher Al content and be thinner as compared to the second film of the barrier layer.

Embodiment 13

An electronic device can include a channel layer having a major surface; and a gate electrode overlying the channel layer. A first portion of the gate electrode can include a first dopant having a first conductivity type, the first portion of the gate electrode can have a first dopant concentration profile in a direction substantially perpendicular to the major surface, and the first concentration profile can have at least two peak dopant concentrations.

Embodiment 14

The electronic device of Embodiment 13, wherein the gate electrode can further include a second portion that has a second conductivity type opposite the first conductivity type, and the first portion of the gate electrode can be disposed between the channel layer and the second portion of the gate electrode.

Embodiment 15

The electronic device of Embodiment 13, wherein the gate electrode can further include a second portion disposed between the channel layer and the first portion of the gate electrode, and the second portion can be a Group 14 film.

Embodiment 16

The electronic device of Embodiment 13, wherein the first portion of the gate electrode can lie along a surface of the gate electrode closest to the channel layer.

Embodiment 17

The electronic device of Embodiment 13 can further include a barrier layer disposed between the channel layer and the gate electrode, wherein the barrier layer includes a first film and a second film, wherein the first film is disposed between the channel layer and the second film and has a higher Al content as compared to the second film. The electronic device can further include a source electrode that makes an ohmic contact with the barrier layer; a drain electrode that makes an ohmic contact with the barrier layer; and a gate interconnect that makes a Schottky contact with the gate electrode. The gate electrode can further include a second portion that is undoped or includes a second dopant having a second conductivity type opposite the first conductivity type, and the first portion of the gate electrode can be disposed between the channel layer and the second portion of the gate electrode.

Embodiment 18

An electronic device can include a channel layer having a major surface; and a gate electrode overlying the channel layer and including a first portion and a second portion, wherein the first portion of the gate electrode is disposed between the channel layer and the second portion of the gate electrode. The first portion of the gate electrode can be undoped or has an average dopant concentration of at most $5 \times 10^{16}$ atoms/cm$^3$, and the second portion of the gate electrode can include a first dopant having a first conductivity type.

Embodiment 19

The electronic device of Embodiment 18, wherein the gate electrode can further include a third portion that includes a second dopant having a second conductivity type opposite the first conductivity type, and the second portion of the gate electrode can be disposed between the first portion and the third portion of the gate electrode.

Embodiment 20

The electronic device of Embodiment 18, wherein the gate electrode can further include a third portion including a Group 14 semiconductor base material, the second portion of the gate electrode can have a different semiconductor base material as compared to the third portion of the gate electrode, and the second portion of the gate electrode can be disposed between the first portion and the third portion of the gate electrode.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
   forming a barrier layer;
   forming a gate electrode layer over the barrier layer, wherein forming the gate electrode layer comprises:
     forming a first film of the gate electrode layer, wherein the first film includes a first III-V material;
     forming a first dopant region of the gate electrode layer, wherein the first dopant region has a first conductivity type;
     forming a second film of the gate electrode layer overlying the first film of the gate electrode layer, wherein the second film includes a second III-V material and is formed after forming the first dopant region; and
     forming a second dopant region of the gate electrode layer, wherein the second dopant region overlies the first dopant region and has the first conductivity type;
   merging the first dopant region and the second dopant region together to form a diffused doped region by diffusing a dopant from each of the first dopant region and the second dopant region;
   patterning the gate electrode layer to form a gate electrode; and
   forming a gate interconnect over the gate electrode,
   wherein after forming the gate interconnect, a first portion of the gate electrode contacts the barrier layer and is undoped or has an average dopant concentration of the first conductivity type that is at most $5 \times 10^{16}$ atoms/cm$^3$.

2. The process of claim 1, further comprising forming a channel layer having a major surface before forming the first film of the gate electrode layer, wherein, after forming the gate interconnect:
   the diffused doped region has a dopant concentration profile in a direction substantially perpendicular to the major surface, and
   the dopant concentration profile has at least two peak dopant concentrations, wherein one of the at least two peak dopant concentrations corresponds to the first dopant region, and another one of the at least two peak dopant concentrations corresponds to the second dopant region.

3. The process of claim 1, wherein forming the first dopant region comprises forming spaced-apart droplets including atoms of a dopant over the first film before forming the second film.

4. The process of claim 1, wherein forming the first dopant region or forming the second dopant region comprises using a Mg precursor that includes Mg, C, and H atoms and does not include a different metal or O atom as a dopant source.

5. The process of claim 1, wherein forming the first dopant region or forming the second dopant region comprises implanting Mg into the first film or the second film of the gate electrode layer.

6. The process of claim 1, wherein forming the gate electrode layer further comprises forming a third film of the gate electrode layer over the second film of the gate electrode layer, wherein after forming the gate interconnect, the third film includes a dopant having a second conductivity type opposite the first conductivity type.

7. The process of claim 1, further comprising forming a third film of the gate electrode layer over the second film of the gate electrode layer, wherein the third film of the gate electrode layer is a polycrystalline Si film.

8. The process of claim 1, further comprising forming a silicon nitride layer over the first film and the second film of the gate electrode layer, wherein some Si during formation of or from the silicon nitride layer migrates into the gate electrode layer to form a Si-doped region within the gate electrode layer.

9. The process of claim 8, wherein patterning the gate electrode layer is performed after forming the silicon nitride layer.

10. The process of claim 1, wherein forming the gate interconnect is performed such that the gate interconnect contacts a surface of the gate electrode to form a Schottky contact.

11. The process of claim 1, wherein forming the gate interconnect is performed such that the gate interconnect contacts a surface of the gate electrode to form an ohmic contact.

12. The process of claim 1, forming the barrier layer comprises:
    forming a first film of the barrier layer; and
    forming a second film of the barrier layer, wherein:
forming the second film of the barrier layer is performed after forming the first film of the barrier layer and before forming the first film of the gate electrode layer, and
the first film of the barrier layer has a higher Al content and is thinner as compared to the second film of the barrier layer.

13. A process of forming an electronic device comprising:
forming a gate electrode layer comprising:
forming a first film of the gate electrode layer, wherein the first film includes a first III-V material;
forming a first dopant region of the gate electrode layer, wherein the first dopant region has a first conductivity type; and
forming a second film of the gate electrode layer overlying the first film of the gate electrode layer, wherein the second film includes a second III-V material;
forming a silicon nitride layer over the second film of the gate electrode layer, wherein:
forming the silicon nitride layer is performed using a silicon-containing gas and a nitrogen-containing gas at a temperature of at least 750° C., and
the silicon-containing gas includes $SiH_4$, $SiH_3Cl$, $SiH_2Cl_2$, or $SiHCl_3$, and the nitrogen-containing gas includes $NH_3$, $N_2$, $N_2O$, or $N_2H_4$;
patterning the gate electrode layer to form a gate electrode;
thermally annealing the silicon nitride layer such that some Si from the silicon nitride layer migrates into the gate electrode layer or the gate electrode and forms a Si-doped region within the gate electrode layer or the gate electrode, and the Si-doped region has a second conductivity type that is opposite the first conductive type, wherein thermally annealing is performed after forming the silicon nitride layer; and
forming a gate interconnect that contacts the Si-doped region of the gate electrode.

14. The process of claim 13, wherein forming the first dopant region comprises using a Mg precursor that includes Mg, C, and H atoms and does not include a different metal or O atom as a dopant source.

15. The process of claim 13, wherein forming the gate interconnect is performed such that the contact between the gate interconnect and the gate electrode is a Schottky contact.

16. The process of claim 13, further comprising:
forming a barrier layer before forming the first film;
forming a dielectric layer over the silicon nitride layer;
defining a gate contact opening extending through the dielectric layer and the silicon nitride layer to expose the gate electrode;
defining a source contact opening extending through the dielectric layer to expose the barrier layer;
forming a source interconnect that extends into the source contact opening and contacts a surface of the barrier layer to form an ohmic contact;
defining a drain contact opening extending through the dielectric layer to expose the barrier layer; and
forming a drain interconnect that extends into the drain contact opening and contacts the surface of the barrier layer to form an ohmic contact.

17. The process of claim 13, further comprising:
forming a third film of the gate electrode layer after forming the first film of the gate electrode layer and before forming the second film of the gate electrode layer, wherein the third film includes a third III-V material, and
forming a second dopant region of the gate electrode layer, wherein the second dopant region overlies the first dopant region and has the first conductivity type.

18. The process of claim 17, further comprising merging the first dopant region and the second dopant region together to form a diffused doped region by diffusing a dopant from each of the first dopant region and the second dopant region.

19. The process of claim 18, further comprising forming a channel layer having a major surface before forming the first film of the gate electrode layer, wherein, after forming the gate interconnect:
the gate electrode includes the diffused doped region that has a dopant concentration profile in a direction substantially perpendicular to the major surface, and
the dopant concentration profile has at least two peak dopant concentrations, wherein one of the at least two peak dopant concentrations corresponds to the first dopant region, and another one of the at least two peak dopant concentrations corresponds to the second dopant region.

20. A process of forming an electronic device comprising:
forming a channel layer having a major surface and including $Al_zGa_{(1-z)}N$, where $$0 \leq z \leq 0.1;$$

forming a barrier layer over the channel layer, wherein forming the barrier layer includes a III-N semiconductor base material;
forming a gate electrode layer over the barrier layer comprising:
forming a first film of the gate electrode layer, wherein the first film includes a first III-V material and has an exposed surface;
decomposing a Mg precursor to form a first set of Mg atoms within a first dopant region along the exposed surface of the first film;
forming a second film of the gate electrode layer after decomposing the Mg precursor, wherein the second film includes a second III-V material and has an exposed surface;
decomposing the Mg precursor to form a second set of Mg atoms within a second dopant region along the exposed surface of the second film; and
forming a third film of the gate electrode layer after decomposing the Mg precursor, wherein the third film includes a third III-V material;
merging the first dopant region and the second dopant region together to form a diffused doped region by diffusing Mg atoms from each of the first set of Mg atoms and the second set of Mg atoms;
patterning the gate electrode layer to form a gate electrode; and
forming a gate interconnect that contacts the gate electrode.

* * * * *